United States Patent
Kikuchi et al.

(10) Patent No.: US 7,639,546 B2
(45) Date of Patent: Dec. 29, 2009

(54) NONVOLATILE MEMORY UTILIZING MIS MEMORY TRANSISTORS WITH FUNCTION TO CORRECT DATA REVERSAL

(75) Inventors: Takashi Kikuchi, Fukuoka (JP); Kenji Noda, Fukuoka (JP)

(73) Assignee: Nscore Inc., Fukuoka (JP)

( * ) Notice: Subject to any disclaimer, the term of this patent is extended or adjusted under 35 U.S.C. 154(b) by 150 days.

(21) Appl. No.: 12/037,414

(22) Filed: Feb. 26, 2008

(65) Prior Publication Data

US 2009/0213664 A1 Aug. 27, 2009

(51) Int. Cl.
*G11C 7/00* (2006.01)
(52) U.S. Cl. .............................. 365/189.05; 365/185.08
(58) Field of Classification Search ............. 365/185.08
See application file for complete search history.

(56) References Cited

U.S. PATENT DOCUMENTS

| | | | |
|---|---|---|---|
| 3,636,530 A | 1/1972 | Mark | |
| 4,419,744 A | 12/1983 | Rutter | |
| 5,956,269 A | 9/1999 | Ouyang et al. | |
| 6,038,168 A | 3/2000 | Allen | |
| 6,064,590 A | 5/2000 | Han et al. | |
| 6,740,927 B1 | 5/2004 | Jeng | |
| 6,906,953 B2 | 6/2005 | Forbes | |
| 6,906,962 B2 | 6/2005 | Layman | |
| 6,909,635 B2 | 6/2005 | Forbes | |
| 7,149,104 B1 * | 12/2006 | Horiuchi | 365/154 |
| 7,227,234 B2 | 6/2007 | Roizin et al. | |
| 7,414,903 B2 * | 8/2008 | Noda | 365/201 |
| 7,483,290 B2 * | 1/2009 | Kikuchi et al. | 365/154 |
| 2004/0252554 A1 | 12/2004 | Fournel et al. | |

FOREIGN PATENT DOCUMENTS

| | | |
|---|---|---|
| JP | 06-076582 | 3/1994 |
| JP | 06-231587 | 8/1994 |
| JP | 2001-156188 | 6/2001 |
| JP | 2002-237540 | 8/2002 |
| WO | 2004/057621 | 7/2004 |
| WO | 2006/093629 | 9/2006 |

\* cited by examiner

*Primary Examiner*—Tan T. Nguyen
(74) *Attorney, Agent, or Firm*—Ladas & Parry LLP

(57) ABSTRACT

A nonvolatile semiconductor memory device includes a latch circuit having two nodes, a nonvolatile memory cell including two MIS transistors, a bit swapping unit configured to provide straight connections between the two nodes and the two MIS transistors during a first operation mode and to provide cross connections between the two nodes and the two MIS transistors during a second operation mode, and a control circuit configured to cause, in one of the first and second operation modes, the nonvolatile memory cell to store the data latched in the latch circuit as an irreversible change of transistor characteristics occurring in a selected one of the two MIS transistors, and further configured to cause, in another one of the first and second operation modes, the latch circuit to detect the data stored in the nonvolatile memory cell.

6 Claims, 8 Drawing Sheets

47

NONVOLATILE MEMORY UTILIZING MIS MEMORY TRANSISTORS WITH FUNCTION TO CORRECT DATA REVERSAL

BACKGROUND OF THE INVENTION

1. Field of the Invention

The present invention generally relates to a memory circuit, and particularly relates to a nonvolatile memory circuit which is capable of retaining stored data in the absence of a power supply voltage.

2. Description of the Related Art

Nonvolatile semiconductor memory devices, which can retain stored data even when power is turned off, conventionally include flash EEPROM employing a floating gate structure, FeRAM employing a ferroelectric film, MRAMs employing a ferromagnetic film, etc. There is a new type of nonvolatile semiconductor memory device called PermSRAM. PermSRAM uses a pair of MIS (metal-insulating film-semiconductor) transistors as a nonvolatile memory cell (i.e., the basic unit of data storage). The two paired MIS transistors used as a nonvolatile memory cell in PermSRAM have the same structure as ordinary MIS transistors used for conventional transistor functions (e.g., switching function), and do not require a special structure such as a floating gate or a special material such as a ferroelectric material or ferromagnetic material. The absence of such a special structure and special material offers an advantage in cost reduction. PermSRAM was initially disclosed in PCT/JP2003/016143, which was filed on Dec. 17, 2003, the entire contents of which are hereby incorporated by reference.

On of the two paired MIS transistors used as a nonvolatile memory cell in PermSRAM are configured to experience an irreversible hot-carrier effect on purpose for storage of one-bit data. Here, the irreversible hot-carrier effect refers to the injection of electrons into the oxide film. A difference in the transistor characteristics caused by the hot-carrier effect represents one-bit data "0" or "1". Such a difference may be detected as a difference in the ON current between the two paired MIS transistors by using a sensing circuit such as a one-bit static memory circuit (latch) coupled to the MIS transistor pair.

Each memory cell unit of PermSRAM for storing on-bit data is comprised of a latch circuit and a nonvolatile memory cell. Data supplied from an external source to a PermSRAM are initially written to the latch circuits of the memory cell units corresponding to a selected row. After the writing of data to the latch circuits, a store operation is performed to transfer (copy) the data from the latch circuits to the respective nonvolatile memory cells. In each memory cell unit, the store operation causes a selected one of the two paired MIS transistors constituting the nonvolatile memory cell to experience a hot-carrier effect, and which one is selected depends on whether the data stored in the latch circuit is 0 or 1.

A hot-carrier effect is asymmetric with respect to the source and drain relation of a transistor. When the source node and drain node used to apply a bias for generating a hot-carrier effect are used as a source node and a drain node, respectively, at the time of detecting a drain current, the detected drain current exhibits a relatively small drop caused by the hot-carrier effect. When the source node and drain node used to apply a bias for generating a hot-carrier effect are swapped and used as a drain node and a source node, respectively, at the time of detecting a drain current, the detected drain current exhibits a significant drop caused by the hot-carrier effect. The difference in the detected drain current between these two scenarios is approximately a factor of 10.

Such asymmetric characteristic of a hot-carrier effect, when properly used, may serve to enhance the data write speed of PermSRAM. Certain considerations, however, must be made when utilizing such asymmetric characteristics. Since the source node and drain node are swapped between the data-write operation and the data-read operation, data read from the nonvolatile memory cell appears as being reversed from the data that was originally written to the nonvolatile memory cell.

SUMMARY OF THE INVENTION

It is a general object of the present invention to provide a nonvolatile semiconductor memory device that substantially obviates one or more problems caused by the limitations and disadvantages of the related art.

It is another and more specific object of at least one embodiment of the present invention to provide a PermSRAM that is provided with the function to correct data reversal.

According to at least one embodiment of the present invention, a nonvolatile semiconductor memory device includes a latch circuit having two nodes and configured to latch data that is represented by respective signal levels of the two nodes complementary to each other, a nonvolatile memory cell including two MIS transistors, a bit swapping unit coupled between the latch circuit and the nonvolatile memory cell and configured to provide straight connections between the two nodes and the two MIS transistors during a first operation mode and to provide cross connections between the two nodes and the two MIS transistors during a second operation mode, and a control circuit configured to cause, in one of the first and second operation modes, the nonvolatile memory cell to store the data latched in the latch circuit as an irreversible change of transistor characteristics occurring in a selected one of the two MIS transistors, and further configured to cause, in another one of the first and second operation modes, the latch circuit to detect the data stored in the nonvolatile memory cell.

According to at least one embodiment of the present invention, data transfer from the latch circuit to the nonvolatile memory cell during one of the store and recall operations is conducted without bit swapping while data transfer from the nonvolatile memory cell to the latch circuit is conducted during another one of the store and recall operations with bit swapping. Data reversal occurring due to the nature of PermSRAM during the store and recall operations can thus be corrected by additionally reversing the data through bit swapping during one of the store operation and the recall operation.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention will be described with reference to the accompanying drawings.

The present invention is directed to PermSRAM. Namely, the memory cell transistors of a memory cell are a pair of MIS (metal-insulating film-semiconductor) transistors that have the same structure as ordinary MIS transistors used for conventional transistor functions (e.g., switching function). These memory cell transistors use neither a special structure such as a floating gate nor a special material such as a ferroelectric material or a ferromagnetic material. The two paired MIS transistors are configured to selectively experience a hot-carrier effect on purpose for storage of one-bit data.

The hot-carrier effect leaves an irreversible lingering change in the transistor characteristics to one of the two paired MIS transistors. A change in the transistor characteristics caused by the hot-carrier effect achieves nonvolatile data retention. Which one of the two paired MIS transistors has a stronger lingering change determines whether the stored data is "0" or "1".

Further, a latch (flip-flop) circuit is used to determine data to be stored in the two paired MIS transistors. The latch circuit is also used to read (sense) the data stored in the two paired MIS transistors. The latch circuit and the two paired MIS transistors together constitute a memory cell unit (memory circuit).

In the following description, NMOS transistors are used as an example of the nonvolatile-memory-cell MIS transistors, but such examples are not intended to be limiting. PMOS transistors may as well be used as nonvolatile-memory-cell transistors.

Figure 1:
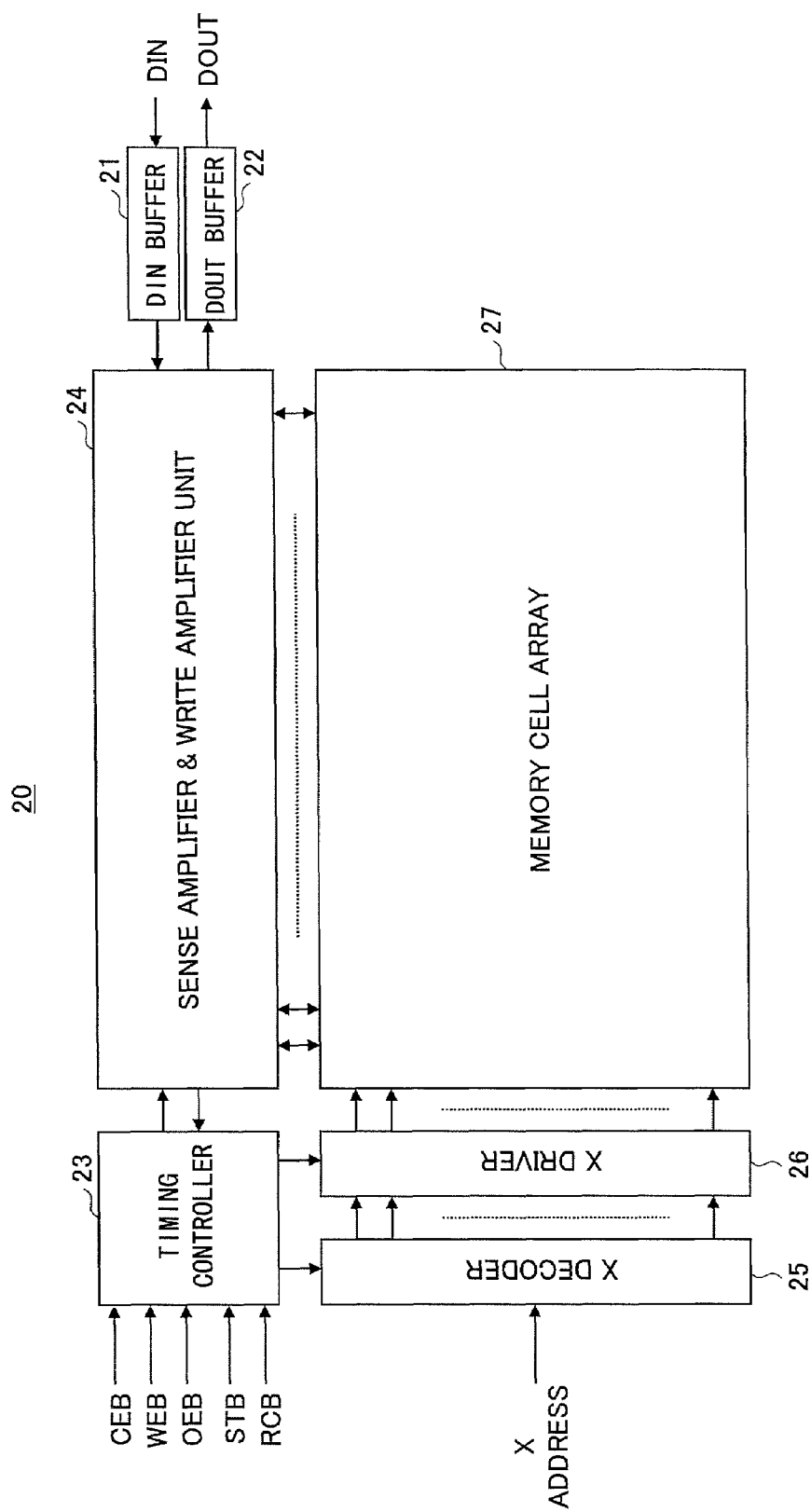
FIG. 1 is a block diagram showing an example of the configuration of a nonvolatile semiconductor memory device according to the present invention.

FIG. 1 is a block diagram showing an example of the configuration of a nonvolatile semiconductor memory device according to the present invention. A semiconductor memory device 20 shown in FIG. 1 includes a DIN buffer 21, a DOUT buffer 22, a timing controller 23, a write-amplifier-&-sense-amplifier unit 24, an X decoder 25, an X driver 26, and a memory cell array 27.

The memory cell array 27 includes a plurality of memory cell units arranged in a matrix form, with a plurality of word lines extending in a first direction, and a plurality of bit lines extending in a second direction perpendicular to the first direction. Each memory cell unit has a circuit configuration as will later be described. The memory cell units arranged in the same column are connected to the same bit lines, and the memory cell units arranged in the same row are connected to the same word line.

The timing controller 23 receives control signals from outside the semiconductor memory device 20, and decodes the control signals to determine an operation mode (e.g., a write operation mode or a read operation mode). These control signals include a store enable signal STB, a recall enable signal RCB, an output enable signal OEB, a write enable signal WEB, and a chip enable signal CEB. Timing control signals responsive to the determined operation mode are supplied from the timing controller 23 to the write-amplifier-&-sense-amplifier unit 24, the X decoder 25, and the X driver 26 for control of the individual parts of the semiconductor memory device 20.

The X decoder 25 receives an X address input from outside the semiconductor memory device 20, and decodes the X address input to determine a selected row. In response to the timing control signals from the timing controller 23 and the decode signals from the X decoder 25, the X driver 26 activates a selected SRAM word line among the SRAM word lines extending from the X driver 26. As a result of the activation of the selected SRAM word line, the corresponding memory cell units are coupled to respective bit line pairs. Through this coupling, the writing/reading of data to/from the memory cell units is performed.

Data read from the memory cell array 27 is supplied to the sense-amplifier-&-write-amplifier unit 24. Sense amplifiers of the sense-amplifier-&-write-amplifier unit 24 amplify the data supplied from the memory cell array 27 for provision to the DOUT buffer 22. The data is output from the DOUT buffer 22 to outside the semiconductor memory device 20 as output data DOUT. Input data DIN supplied to the DIN buffer 21 is provided to the sense-amplifier-&-write-amplifier unit 24. Write amplifiers of the sense-amplifier-&-write-amplifier unit 24 amplify the input data for provision to the memory cell array 27.

Output data DOUT and input data DIN may have a width of 16 bits, for example, and the memory cell array 27 may have a width of 16 bits for each X address that is the same width as the input/output data. In this case, there is no need to specify a Y address to select a column position of the memory cell array 27 for read/write operations.

Figure 2:
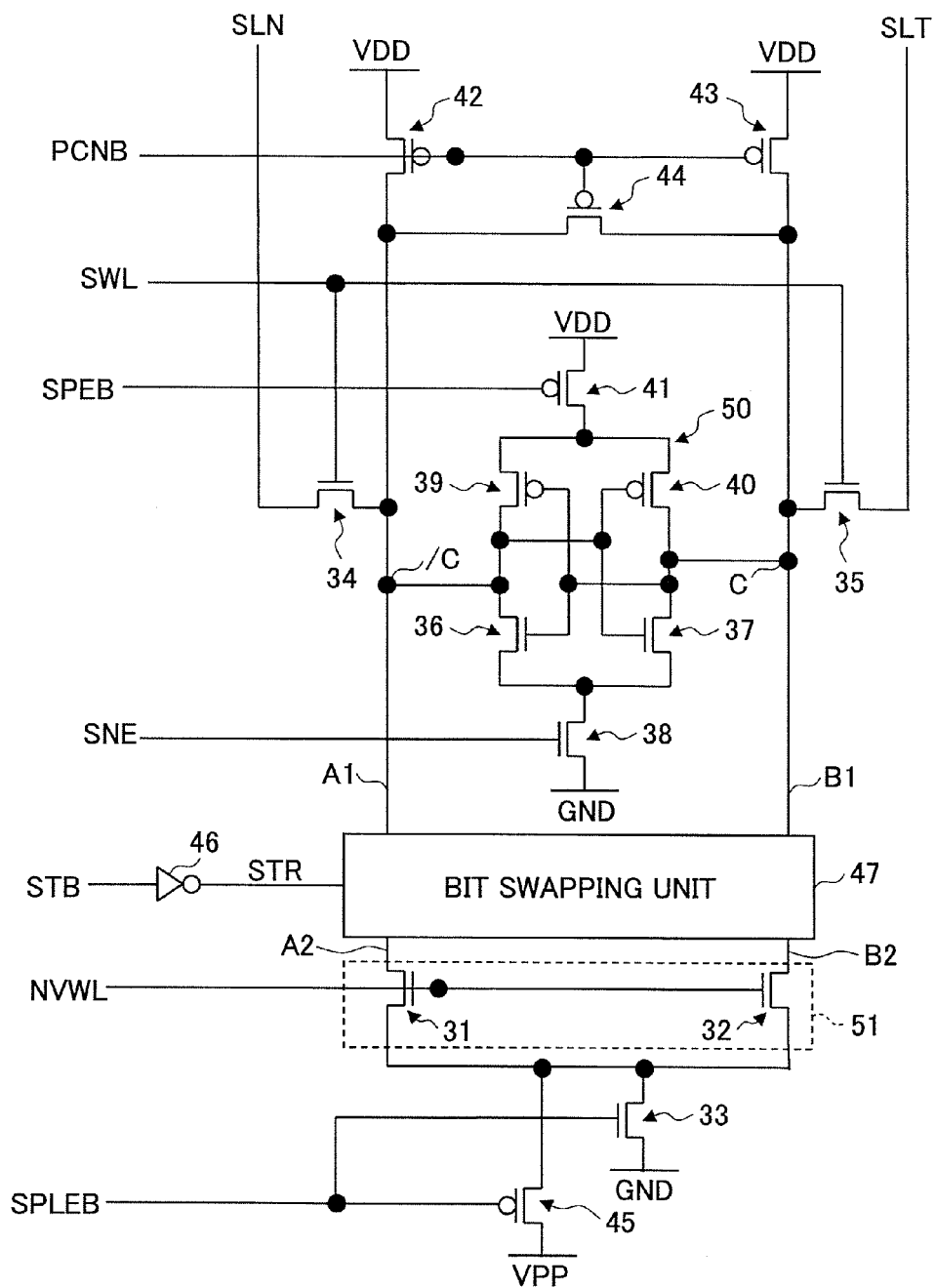
FIG. 2 is an illustrative drawing showing an example of the configuration of a memory cell unit used in a memory cell array of FIG. 1.

FIG. 2 is an illustrative drawing showing an example of the configuration of a memory cell unit used in the memory cell array 27 of FIG. 1. Each memory cell unit of the memory cell array 27 has the circuit configuration as shown in FIG. 2.

A memory cell unit 30 illustrated in FIG. 2 includes NMOS transistors 31 through 38, PMOS transistors 39 through 45, an inverter 46, and a bit swapping unit 47. The NMOS transistors 31 and 32 are a pair of MIS transistors serving as a nonvolatile memory cell 51, and have their gate nodes coupled to an NV word line NVWL. The NMOS transistors 36 through 38 and PMOS transistors 39 through 41 together constitute an SRAM (Static Random Access Memory) cell 50 (i.e., latch circuit), which serves as a sensing circuit to sense data stored in the nonvolatile memory cell 51.

The NMOS transistors 31 and 32 serving as nonvolatile memory cell transistors have the same structure as the other NMOS transistors including the NMOS transistors 36 through 38 of the SRAM cell 50 and the NMOS transistors 34 and 35 used as transfer gates between the SRAM cell 50 and SRAM data lines (bit lines) SLN and SLT. Further, it is preferable to manufacture all the MOS transistors of the memory cell unit 30 with the same thickness of a gate oxide film, so that all the MOS transistors shown in FIG. 2 may be designed to operate with the same operating voltage (e.g., 1.8 V). Namely, the NMOS transistors 31 and 32 are conventional MIS transistors designed to operate with a power supply voltage of 1.8 V, for example. When the NMOS transistors 31 and NMOS transistor 32 are driven with a voltage no greater than 1.8 V, a change in the characteristics due to a hot-carrier effect does not occur from a practical point of view.

As illustrated in FIG. 2, the SRAM data lines SLN and SLT, which extend from the write-amplifier-&-sense-amplifier unit 24 (see FIG. 1), are coupled to the SRAM cell 50 via the NMOS transistors 34 and 35 serving as a data transfer unit. An SRAM word line SWL, which extends from the X driver 26 (see FIG. 1), is connected to the gates of the NMOS transistors 34 and 35. With the SRAM word line SWL set to HIGH, data can be written to and read from the SRAM cell 50 via the SRAM data lines SLN and SLT. The NV word line NVWL, which extends from the X driver 26, is coupled to the gate nodes of the NMOS transistors 31 and 32 serving as the nonvolatile memory cell 51.

A cell precharge line PCNB and a store plate voltage enable line SPLEB extending from the X driver 26 (see FIG. 1) are connected to the memory cell unit 30. Specifically, the cell precharge line PCNB is coupled to the gates of the PMOS transistors 42 through 44 for the purpose of precharging and equalizing nodes C and /C. The store plate voltage enable line SPLEB is coupled to the gate of the NMOS transistor 33. In response to the HIGH state of the store plate voltage enable line SPLEB, the NMOS transistor 33 becomes conductive, and the data stored in the nonvolatile memory cell 51 is recalled through recall operation, i.e., the data stored in the NV cell unit 51 is transferred to the SRAM cell 50. The store plate voltage enable line SPLEB is also coupled to the gate of the PMOS transistor 45. In response to the LOW state of the store plate voltage enable line SPLEB, the PMOS transistor 45 becomes conductive, so that the data stored in the SRAM cell 50 is stored in the nonvolatile memory cell 51 through store operation, i.e., the data stored in the SRAM cell 50 is transferred to the nonvolatile memory cell 51.

An SRAM NMOS enable line SNE and an SRAM PMOS enable line SPEB extending from the X driver 26 (see FIG. 1) are connected to the memory cell unit 30. Specifically, the SRAM NMOS enable line SNE and the SRAM PMOS enable line SPEB are coupled to the gate of the NMOS transistor 38 and to the gate of the PMOS transistor 41, respectively, so as to control the on/off state of the SRAM cell 50. Such control is necessary when recalling data from the nonvolatile memory cell 51 to the SRAM cell 50.

A store enable line for supplying the store enable signal STB extending from the X driver 26 is coupled to the input node of the inverter 46. The output of the inverter 46 is a switch transfer signal STR, which is supplied to the bit swapping unit 47. When data latched in the SRAM cell 50 is to be stored in the nonvolatile memory cell 51, the store enable signal STB is asserted to a low level, thereby setting the switch transfer signal STR to a high level. When the data stored in the nonvolatile memory cell 51 is to be recalled and transferred to the SRAM cell 50, the store enable signal STB is negated to a high level, thereby setting the switch transfer signal STR to a low level. The bit swapping unit 47 switches electrical couplings between nodes A1 and B1 and nodes A2 and B2 in response to the switch transfer signal STR.

Figure 3:
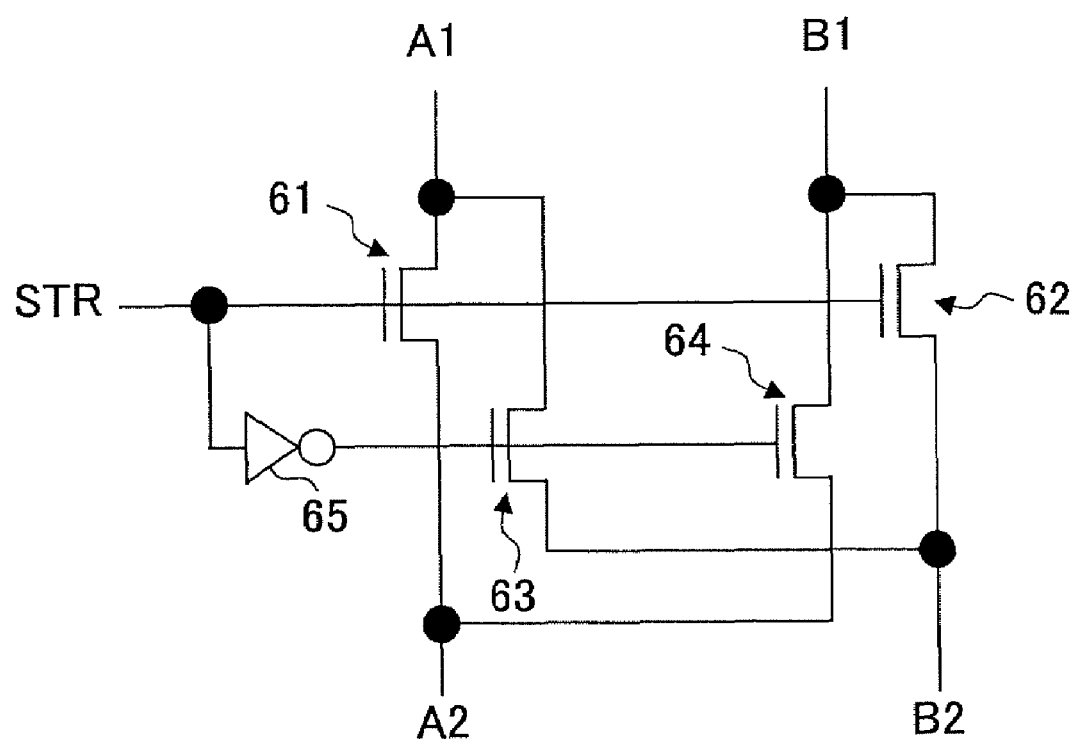
FIG. 3 is a drawing showing an example of the configuration of a bit swapping unit.

FIG. 3 is a drawing showing an example of the configuration of the bit swapping unit 47. The bit swapping unit 47 shown in FIG. 3 includes NMOS transistors 61 through 64 and an inverter 65. The switch transfer signal STR is applied to the gates of the NMOS transistors 61 and 62. An inverse of the switch transfer signal STR output from the inverter 65 is applied to the gates of the NMOS transistors 63 and 64. The nodes A1, A2, B1, and B2 shown in FIG. 3 correspond to the nodes A1, A2, B1, and B2 as appear in FIG. 2.

During a store operation that transfers data latched in the SRAM cell 50 to the nonvolatile memory cell 51 for nonvolatile data storage, the switch transfer signal STR is set to HIGH. In this case, the NMOS transistors 61 and 62 are conductive while the NMOS transistors 63 and 64 are nonconductive. The node A1 is electrically coupled to the node A2, and the node B1 is electrically coupled to the node B2. During a recall operation in which the SRAM cell 50 serving as a sense circuit senses (detects) data stored in the nonvolatile memory cell 51, the switch transfer signal STR is set to LOW. In this case, the NMOS transistors 61 and 62 are nonconductive while the NMOS transistors 63 and 64 are conductive. The node A1 is electrically coupled to the node B2, and the node B1 is electrically coupled to the node A2.

Turning to FIG. 2 again, when data is written to the SRAM cell 50, the electrical nodes C and /C of the SRAM cell 50 are set to respective potentials that are inverse to each other according to the data latched in the SRAM cell 50. For example, the electrical node /C may be set to LOW (=0 V), and the electrical node C may be set to HIGH (=1.8 V). During a store operation, the store plate voltage enable line SPLEB is set to LOW (i.e., 0 V), and the potential of the NV word line NVWL is set to EXH, which is a voltage (e.g., 1.65 V) between 0 V and VPP (3.3 V). This NV word line potential EXH is determined such as to maximize the effect of a hot-carrier phenomenon. Generally, such potential is selected to be half the voltage between the source node and drain node of the transistor that is subjected to a hot-carrier effect. In the store operation, further, the bit swapping unit 47 provides such electrical couplings that the node A1 is electrically coupled to the node A2, and the node B1 is electrically coupled to the node B2.

The signal settings as described above creates a condition in which a voltage of 3.3 V between VPP and the electrical node /C is applied between the drain node and source node of the NMOS transistor 31. Further, a voltage of 1.65 V between the NV word line potential and the electrical node /C is applied between the gate node and source node of this NMOS transistor 31. Since these bias voltages are larger than the voltages used in routine operations, the NMOS transistor 31 experiences a strong hot-carrier effect. In this situation, only the NMOS transistor 31 experiences a hot-carrier effect. The NMOS transistor 32 does not experience a hot-carrier effect because a voltage across their drain node and source node is only 1.5 V, which is within the range of voltages used in routine operations. It should also be noted that an electric current does not flow through the NMOS transistor 32 in this case since the gate node voltage is no higher than the source node voltage.

During a recall operation, the store plate voltage enable line SPLEB is set to VPP (=3.3 V), and the potential of the NV word line NVWL is set to HIGH (=1.8 V). In the recall operation, further, the bit swapping unit 47 provides such electrical couplings that the node A1 is electrically coupled to the node B2, and the node B1 is electrically coupled to the node A2. In order to recall (read) the data from the NV cell unit 51, the SRAM cell 50 is initially placed in an electrically inactive state, and is then shifted to an electrically active state. This is achieved by shifting the potential of the SRAM PMOS enable line SPEB from 1.8 V to 0 V and the potential of the SRAM NMOS enable line SNE from 0 V to 1.8 V.

In the example of the store operation previously described, the node /C was LOW, so that the NMOS transistor 31 experienced a hot carrier effect. In such case, the NMOS transistor 31 has a lingering change in the transistor characteristics due to the hot-carrier effect whereas the NMOS transistor 32 does not have such a lingering change. The on-resistance of the NMOS transistor 31 is thus larger than the on-resistance of the NMOS transistor 32. With the node A1 coupled to the node B2 and the node B1 coupled to the node A2, the force that pulls down the electrical node /C to the ground level is stronger than the force that pulls down the electrical node C to the ground level. After the activation of the SRAM cell 50, therefore, the electrical node /C is set to the LOW level, and the electrical node C is set to the HIGH level.

In this manner, the original data latched in the SRAM cell 50 with the node /C set to LOW is recalled as the recalled data latched in the SRAM cell 50 with the node /C set to LOW. Namely, the recalled data is the same as the original data without data reversal. Avoidance of data reversal is achieved by the use of the bit swapping unit 47, which provides straight connections in the store operation and cross connections in the recall operation.

Figure 4:
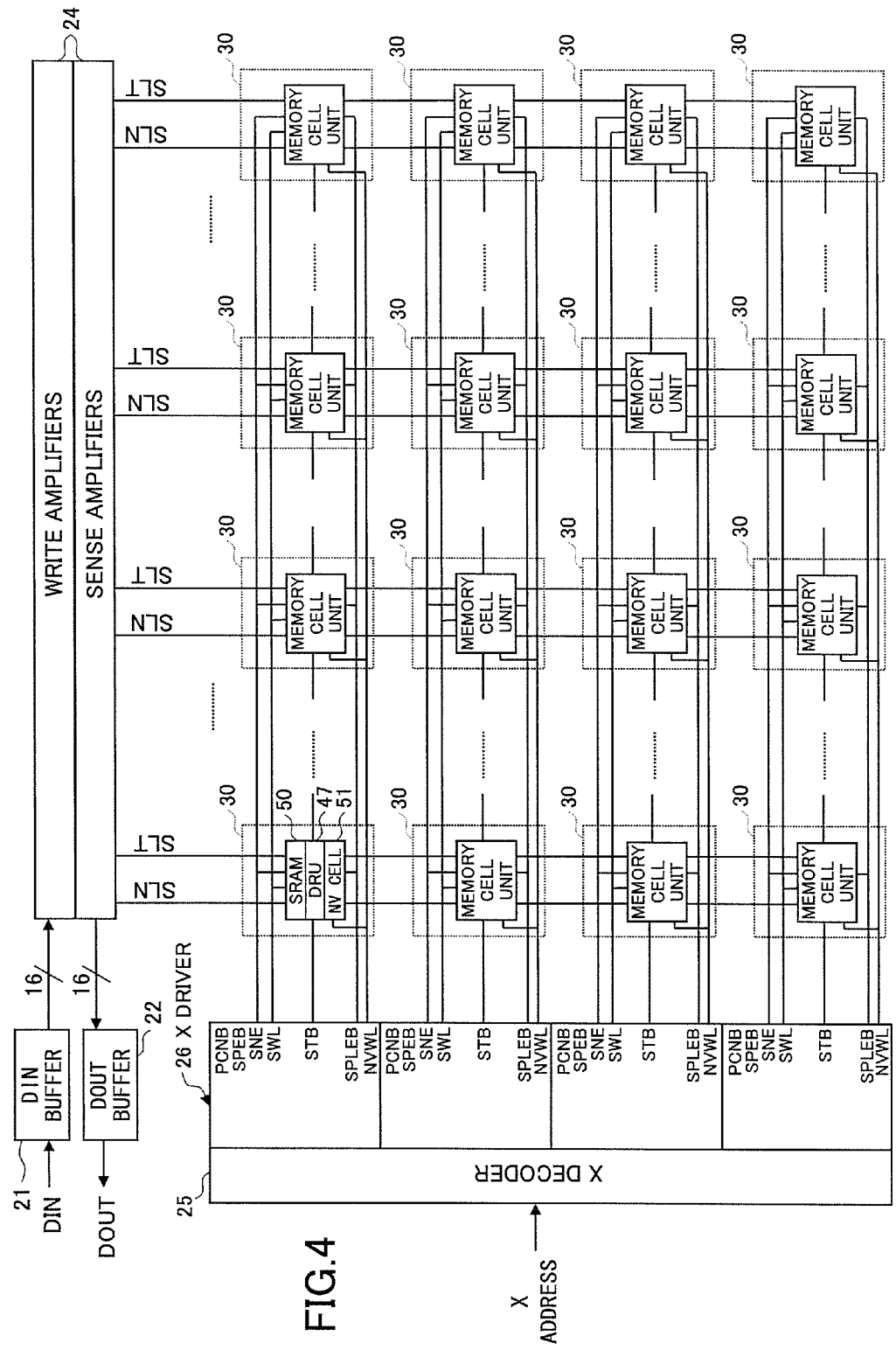
FIG. 4 is a drawing showing a more specific configuration of the memory cell array shown in FIG. 1.

FIG. 4 is a drawing showing a more specific configuration of the memory cell array 27 shown in FIG. 1. In FIG. 4, the same elements as those of FIG. 1 and FIG. 2 are referred to by the same numerals, and a description thereof will be omitted.

The memory cell array 27 shown in FIG. 1 corresponds to a plurality of memory cell units 30, the SRAM data lines SLN and SLT extending from the write-amplifier-&-sense-amplifier unit 24, and the signal lines extending from the X driver 26. Each of the memory cell units 30 has the configuration as shown in FIG. 2, and includes the SRAM cell 50, the bit swapping unit (DRU) 47, and the NV cell unit 51. For the sake of clarity of illustration, however, the SRAM cell 50, the DRU 47, and the NV cell unit 51 are shown in FIG. 4 only with respect to the memory cell unit 30 situated at the top left corner. The X address may be comprised of 2 bits, for example, to select one of a plurality of rows, the number of which is 4 in this example. In FIG. 4, the illustration of the timing controller 23 is omitted for the sake of simplicity of illustration.

The X driver 26 activates a selected SRAM word line SWL to read data from or write data to the SRAM cells 50 with respect to the memory cell units 30 that are connected to the activated SRAM word line SWL. Data transfer between the SRAM cells 50 and the write-amplifier-&-sense-amplifier unit 24 is conducted via the SRAM data lines SLN and SLT.

Figure 5:
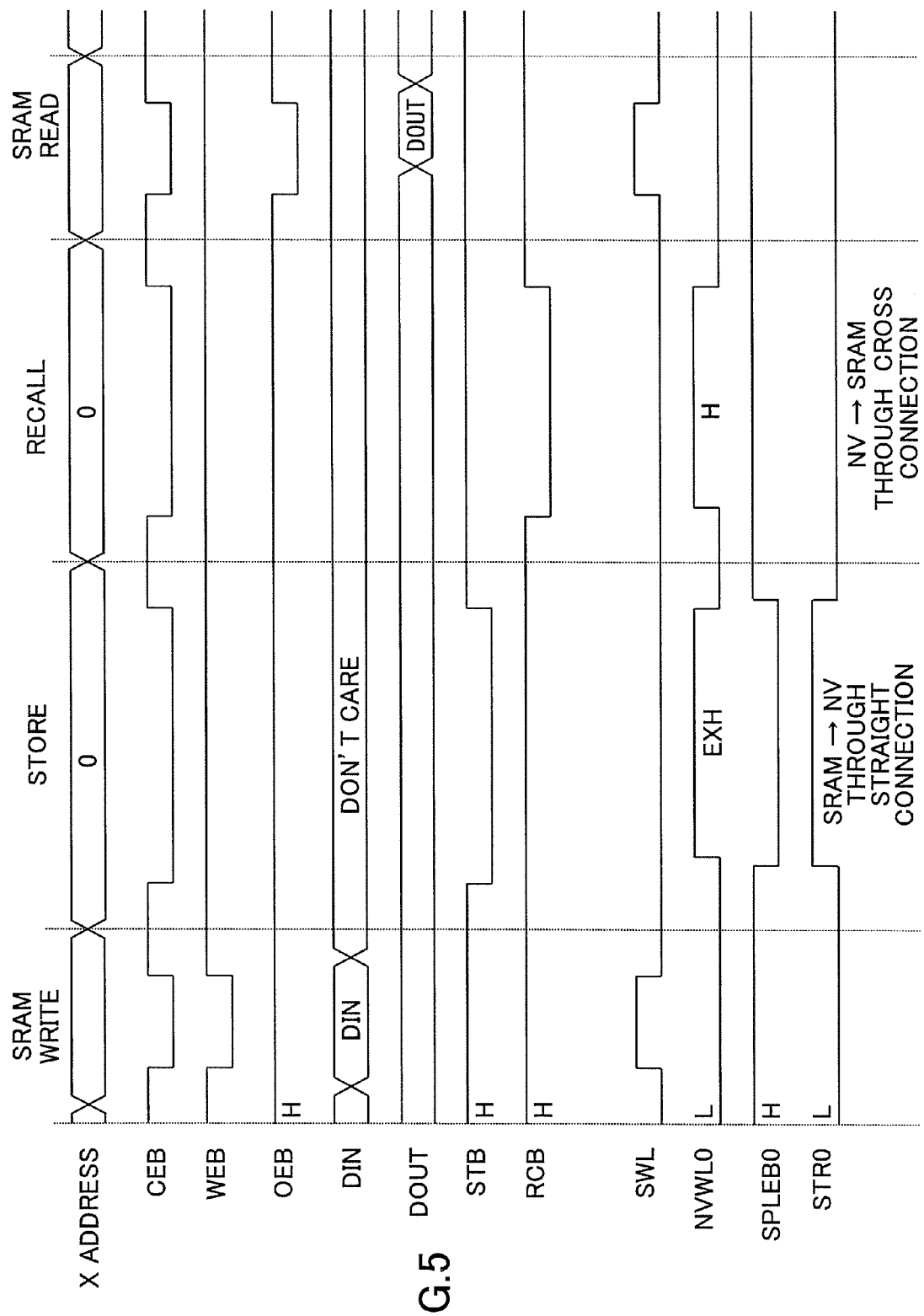
FIG. 5 is a timing chart for explaining operations of the nonvolatile semiconductor memory device shown in FIG. 4.

FIG. 5 is a timing chart for explaining operations of the nonvolatile semiconductor memory device shown in FIG. 4.

The first operation phase shown in FIG. 5 is the writing of data to the SRAM cell 50. The store enable signal STB, the recall enable signal RCB, the output enable signal OEB, the write enable signal WEB, and the chip enable signal CEB are set to respective signal levels as shown in FIG. 5. The X address and input data DIN are supplied to the X decoder 25 and to the DIN buffer 21, respectively (see FIG. 4). The X driver 26 activates a selected SRAM word line SWL as shown in FIG. 5, which is selected by the X decoder 25 according to the supplied X address. As can be seen from FIG. 2, the activation of the SRAM word line SWL to HIGH causes the NMOS transistors 34 and 35 to become conductive. Since the SRAM data lines SLN and SLT are at the respective signal levels responsive to the input data DIN, the input data DIN is stored in the SRAM cell 50 through the NMOS transistors 34 and 35. The writing of data to the SRAM cell 50 is performed with respect to all the memory cell units 30 that are connected to the activated SRAM word line SWL (see FIG. 4).

The second operation phase shown in FIG. 5 is the store operation that stores the data of the SRAM cells 50 in the nonvolatile memory cells 51. The store enable signal STB, the recall enable signal RCB, the output enable signal OEB, the write enable signal WEB, and the chip enable signal CEB are set to respective signal levels as shown in FIG. 5. The semiconductor memory device may be configured such that the store operation is performed with respect to all the memory cell units 30 irrespective of their row positions, or may be configured such that the store operation is performed with respect to only the memory cell units 30 corresponding to a selected row specified by an X address. In the example shown in FIG. 5, the first row is selected by applying the X address "0". A store plate voltage enable line SPLEB0 at the first row is set to LOW, and the potential of the NV word line NVWL0 of the first row is set to EXH, thereby transferring the data from the SRAM cell 50 to the nonvolatile memory cell 51 in each memory cell unit 30 of the first row. Since the store enable signal STB is set to LOW, a switch transfer signal STR0 for the first row is set to HIGH, so that the bit swapping unit 47 provides straight connections. This achieves data transfer from the SRAM cell 50 to the nonvolatile memory cell 51 without bit swapping.

The third operation phase shown in FIG. 5 is the recalling of data from the nonvolatile memory cells 51 to the SRAM cells 50. The store enable signal STB, the recall enable signal RCB, the output enable signal OEB, the write enable signal WEB, and the chip enable signal CEB are set to respective signal levels as shown in FIG. 5. In order to recall (read) the data from the nonvolatile memory cells 51, the SRAM cells 50 are initially placed in an electrically inactive state, and are then shifted to an electrically active state. Prior to the activation of the SRAM cells 50, the store plate voltage enable line SPLEB0 at the first row is set to HIGH, and the potential of the NV word line NVWL0 of the first row is set to HIGH. Upon the activation of the SRAM cells 50, thus, data are recalled from the nonvolatile memory cells 51 with respect to the first row that is specified by the X address. Since the store enable signal STB is set to HIGH, the switch transfer signal STR0 for the first row is set to LOW, so that the bit swapping unit 47 provides cross connections. This achieves data transfer from the nonvolatile memory cell 51 to the SRAM cell 50 with bit swapping.

The fourth operation phase shown in FIG. 5 is the reading of data from the SRAM cells 50. The store enable signal STB, the recall enable signal RCB, the output enable signal OEB, the write enable signal WEB, and the chip enable signal CEB are set to respective signal levels as shown in FIG. 4. An X address to be accessed is supplied to the X decoder 25. The X driver 26 activates a SRAM word line SWL selected by the X decoder 25. As can be seen by referring to FIG. 2, the activation of the SRAM word line SWL to HIGH causes the NMOS transistors 34 and 35 to become conductive. It follows that the data stored in the SRAM cells 50 appear on the SRAM data lines SLN and SLT through the NMOS transistors 34 and 35. The data appearing on the SRAM data lines SLN and SLT are then output from the DOUT buffer 22 as the output data DOUT via the write-amplifier-&-sense-amplifier unit 24 (see FIG. 1 and FIG. 4). It should be noted that the reading of data from the SRAM cells 50 is performed with respect to all the memory cell units 30 that are connected to the activated SRAM word line SWL.

As described above, the data transfer from the SRAM cell 50 to the nonvolatile memory cell 51 during the store operation is conducted without bit swapping while the data transfer from the nonvolatile memory cell 51 to the SRAM cell 50 is conducted with bit swapping. Data reversal occurring due to the nature of PermSRAM during the store and recall operation can thus be corrected by additionally reversing the data through bit swapping during the recall operation.

Figure 6:
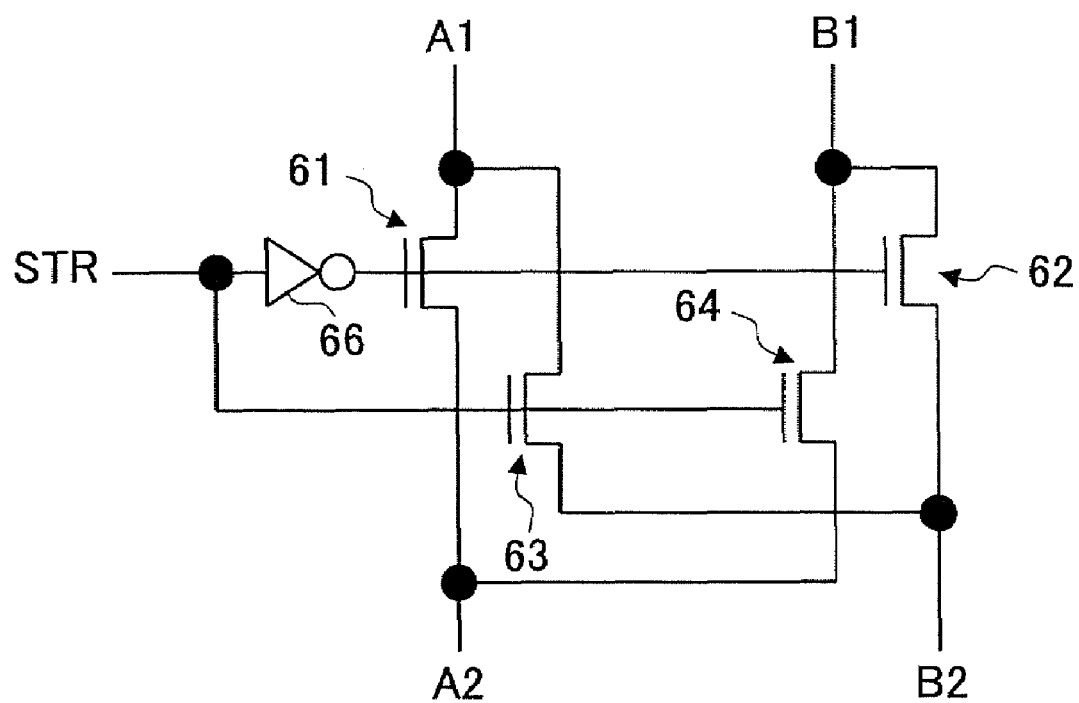
FIG. 6 is a drawing showing another example of the configuration of the bit swapping unit shown in FIG. 2.

FIG. 6 is a drawing showing another example of the configuration of the bit swapping unit 47 shown in FIG. 2. In FIG. 6, the same elements as those of FIG. 3 are referred to by the same numerals, and a description thereof will be omitted.

The circuit configuration shown in FIG. 6 differs from the circuit configuration shown in FIG. 3 in that an inverter 66 is additionally provided while the inverter 65 is removed. With the circuit configuration shown in FIG. 6, the switch transfer signal STR is applied to the gates of the NMOS transistors 63 and 64, and an inverse of the switch transfer signal STR output from the inverter 66 is applied to the gates of the NMOS transistors 61 and 62. During a store operation that transfers data latched in the SRAM cell 50 to the nonvolatile memory cell 51 for nonvolatile data storage, the switch transfer signal STR is set to HIGH. In this case, the NMOS transistors 61 and 62 are nonconductive while the NMOS transistors 63 and 64 are conductive. The node A1 is electrically coupled to the node B2, and the node B1 is electrically coupled to the node A2. During a recall operation in which the SRAM cell 50 serving as a sense circuit senses (detects) data stored in the nonvolatile memory cell 51, the switch transfer signal STR is set to LOW. In this case, the NMOS transistors 61 and 62 are conductive while the NMOS transistors 63 and 64 are nonconductive. The node A1 is electrically coupled to the node A2, and the node B1 is electrically coupled to the node B2.

Accordingly, during the store operation, the bit swapping unit 47 provides cross connections between the SRAM cell 50 and the nonvolatile memory cell 51. This achieves data transfer from the SRAM cell 50 to the nonvolatile memory cell 51 with bit swapping. During the recall operation, on the other hand, the bit swapping unit 47 provides straight connections between the SRAM cell 50 and the nonvolatile memory cell 51. This achieves data transfer from the nonvolatile memory cell 51 to the SRAM cell 50 without bit swapping. Data reversal occurring due to the nature of PermSRAM during the store and recall operation can thus be corrected by additionally reversing the data through bit swapping during the store operation. Namely, either the circuit configuration of the bit swapping unit 47 shown in FIG. 3 or the circuit configuration of the bit swapping unit 47 shown in FIG. 6 achieves the same results.

It should be noted that the configuration of the memory cell unit 30 as shown in FIG. 2 ensures that the data latched in the SRAM cell 50 as recalled from the nonvolatile memory cell 51 is always the same as the original data latched in the SRAM cell 50 as written from the write-amplifier-&-sense-amplifier unit 24. With such arrangement, users need not be aware of the data reversal occurring due to the nature of PermSRAM. Other straightforward arrangements, on the other hand, may still require users to be conscious of such data reversal.

Figure 7:
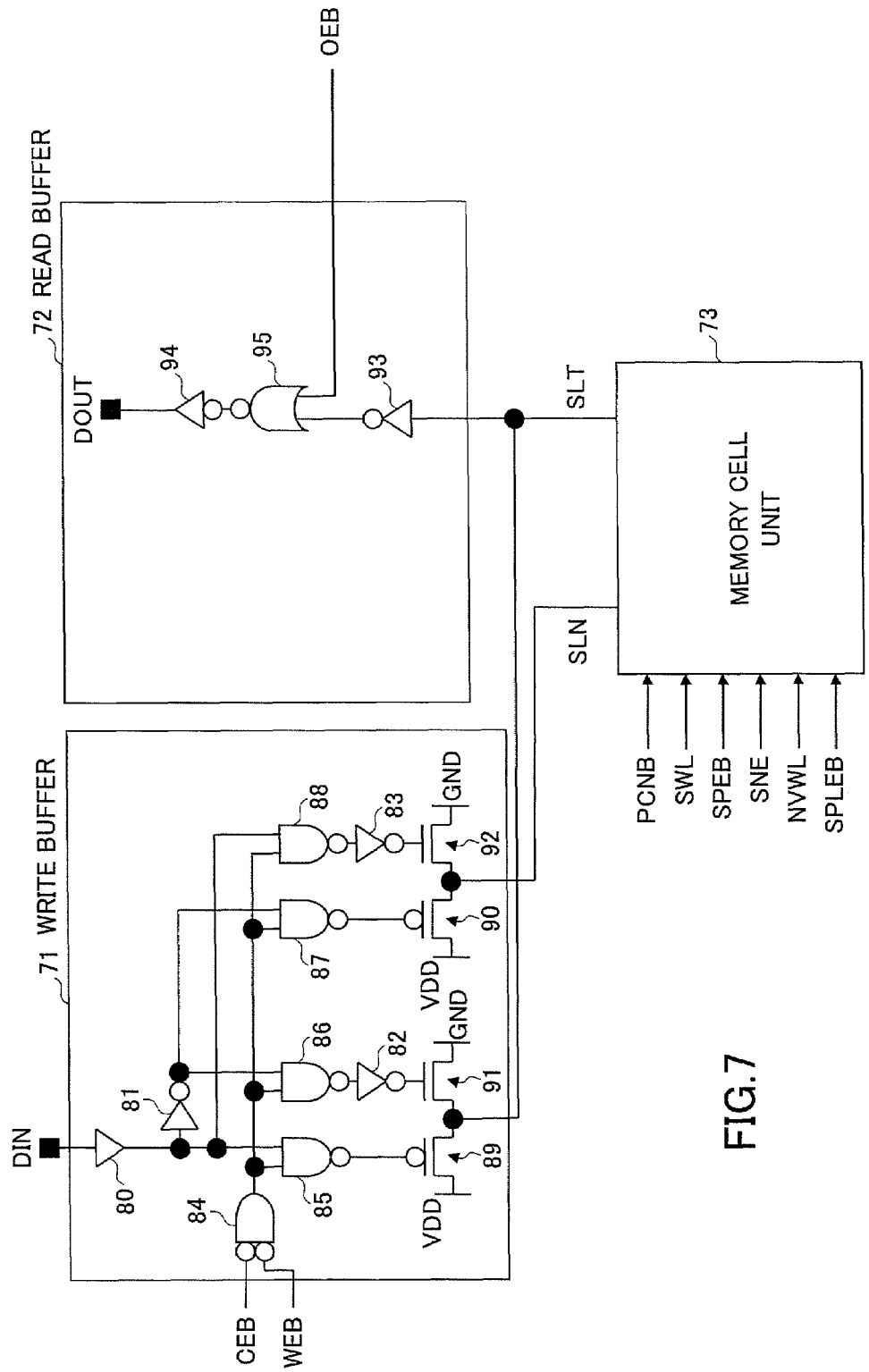
FIG. 7 is a drawing for explaining a straightforward configuration for correcting data reversal occurring in PermSRAM.

FIG. 7 is a drawing for explaining a straightforward configuration for correcting data reversal occurring in PermSRAM. Only a schematic configuration is shown in FIG. 7 for the purpose of explaining the function to correct data reversal, and, thus, does not include the complete illustration of all the functional units of a semiconductor memory device.

Figure 8:
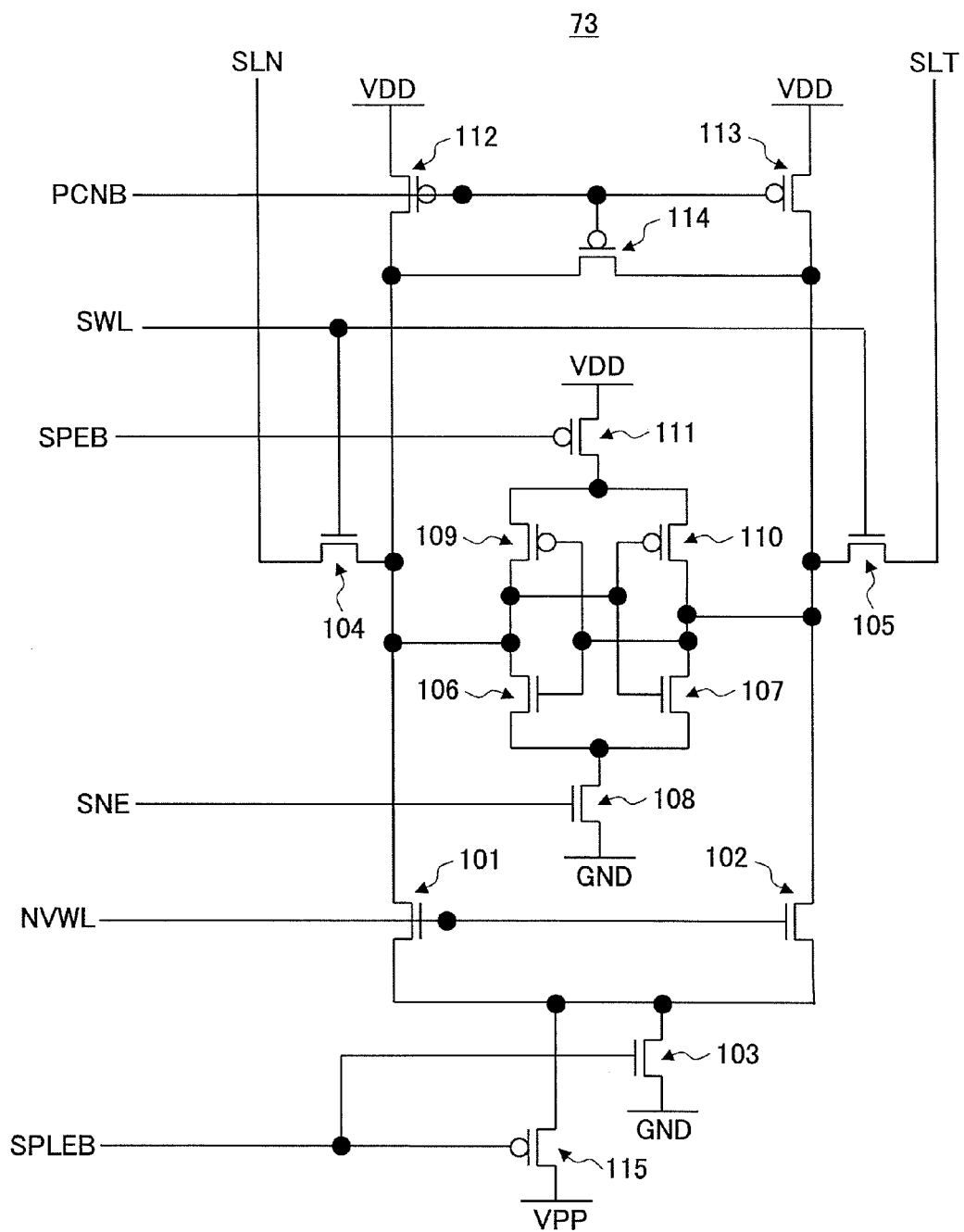
FIG. 8 is drawing showing an example of the configuration of a typical PermSRAM memory cell unit.

The schematic configuration shown in FIG. 7 includes a write buffer 71, a read buffer 72, and a memory cell unit 73. The memory cell unit 73 is that of a typical PermSRAM, and may have the configuration as shown in FIG. 8. FIG. 8 is drawing showing an example of the configuration of a typical PermSRAM memory cell unit. The memory cell unit 73 shown in FIG. 8 includes NMOS transistors 101 through 108 and PMOS transistors 109 through 115. The NMOS transistors 101 and 102 are a pair of MIS transistors serving as a nonvolatile memory cell. The NMOS transistors 106 through 108 and PMOS transistors 109 through 111 together constitute an SRAM cell. The memory cell unit 73 differs from the memory cell unit 30 shown in FIG. 2 only in that the bit swapping unit 47 is not provided. Since the bit swapping unit 47 is nonexistent, data latched in the SRAM cell as recalled from the nonvolatile memory cell is reversed from the original data written to the SRAM cell via the bit lines SLN and SLT.

Referring to FIG. 7 again, the write buffer 71 includes a buffer 80, inverters 81 through 83, a NOR gate 84, NAND gates 85 through 88, PMOS transistors 89 and 90, and NMOS transistors 91 and 92. The write buffer 71 receives one bit data DIN, and writes two bit data to the memory cell unit 73 via the bit lines BLN and BLT. The read buffer 72 includes an inverter 93, an inverting buffer 94, a NOR gate 95. When the recalled data is read from the memory cell unit 73, the output enable signal OEB is set to HIGH, so that an inversion of the bit value appearing on the bit line SLT as inverted by the inverter 93 is output as output data DOUT to outside the semiconductor memory device.

In this configuration, the inverter 93 serves to correct data reversal occurring in PermSRAM. That is, when such data as the bit line SLT is set to HIGH is written from the write buffer 71 to the memory cell unit 73 and stored in its nonvolatile memory cell, data that is subsequently recalled from the nonvolatile memory cell ends up setting the bit line SLT to LOW upon reading of the recalled data from the SRAM cell. The inverter 93 reverses the bit value appearing on the bit line SLT so as to output a HIGH bit value as the output data DOUT, thereby correcting the data reversal associated with the operation of PermSRAM.

The configuration of FIG. 7, however, does not directly correct the data of the SRAM cell as recalled from the nonvolatile memory cell. That is, the recalled data stored in the SRAM cell remains in a reversed state. The correction of reversed data is performed only on the data path along which data is output to outside the semiconductor memory device. In such configuration, a user still needs to be conscious of data reversal when using the semiconductor memory device. Such consciousness becomes necessary when the user attempts to read data from the SRAM cell without performing the store and recall operation. That is, some user may want to write data to the memory cell unit 73, and to read the written data from the memory cell unit 73 without going through the store and recall operation. Such writing and immediate reading of data may be performed for the purpose of testing the function of the SRAM cell. Since the data read from the memory cell unit 73 is reversed by the inverter 93, the retrieved data will be reversed from the data written to the memory cell unit 73. The user thus has to be conscious of such data reversal.

The configuration of the memory cell unit 30 as shown in FIG. 2, on the other hand, ensures that the data latched in the SRAM cell 50 as recalled from the nonvolatile memory cell 51 is always the same as the original data latched in the SRAM cell 50 as written from the write-amplifier-&-sense-amplifier unit 24. Data retrieved from the memory cell unit 30 after store and recall operations is identical to the data as originally written. Also, data retrieved from the memory cell unit 30 immediately after the write operation without going through any store and recall operations is identical to the data as originally written. With this arrangement, thus, users need not be aware of the data reversal occurring due to the nature of PermSRAM.

Further, the present invention is not limited to these embodiments, but various variations and modifications may be made without departing from the scope of the present invention.

What is claimed is:

1. A nonvolatile semiconductor memory device, comprising:
   a latch circuit having two nodes and configured to latch data that is represented by respective signal levels of the two nodes complementary to each other;
   a nonvolatile memory cell including two MIS transistors;
   a bit swapping unit coupled between the latch circuit and the nonvolatile memory cell and configured to provide straight connections between the two nodes and the two MIS transistors during a first operation mode and to provide cross connections between the two nodes and the two MIS transistors during a second operation mode; and
   a control circuit configured to cause, in one of the first and second operation modes, the nonvolatile memory cell to store the data latched in the latch circuit as an irreversible change of transistor characteristics occurring in a selected one of the two MIS transistors, and further configured to cause, in another one of the first and second operation modes, the latch circuit to detect the data stored in the nonvolatile memory cell.

2. The nonvolatile semiconductor memory device as claimed in claim 1, wherein the nonvolatile memory cell is configured such that which one of the two MIS transistors experiences the irreversible change of transistor characteristics depends on a value of the data latched in the latch circuit.

3. The nonvolatile semiconductor memory device as claimed in claim 1, wherein the latch circuit is configured to detect the data stored in the nonvolatile memory cell in response to the irreversible change of transistor characteristics in one of the two MIS transistors of the nonvolatile memory cell.

4. The nonvolatile semiconductor memory device as claimed in claim 1, wherein the bit swapping unit is configured to provide an electrical coupling between a first one of the two nodes and a first one of the MIS transistors and an electrical coupling between a second one of the two nodes and a second one of the MIS transistors during the first operation mode, and is configured to provide an electrical coupling between the first one of the two nodes and the second one of the MIS transistors and an electrical coupling between the second one of the two nodes and the first one of the MIS transistors during the second operation mode.

5. The nonvolatile semiconductor memory device as claimed in claim 1, wherein the two MIS transistors have first ends thereof coupled to the two nodes of the latch circuit through the bit swapping unit, and have second ends thereof opposite the first ends, and wherein the control circuit is configured to couple the second ends to a first potential during the first operation mode and to couple the second ends to a second potential during the second operation mode such that an electric current flows through the two MIS transistors in the first operation mode in a direction opposite to a direction in which an electric current flows through the two MIS transistors in the second operation mode.

6. The nonvolatile semiconductor memory device as claimed in claim 1, comprising a plurality of memory cell units arranged in rows and columns, each of the memory cell units having an identical circuit configuration including the latch circuit, the nonvolatile memory cell, and the bit swapping unit.

* * * * *